(12) United States Patent
Gaddipati et al.

(10) Patent No.: US 7,023,207 B1
(45) Date of Patent: Apr. 4, 2006

(54) METHOD AND SYSTEM OF MR IMAGING WITH REDUCED RADIAL RIPPLE ARTIFACTS

(75) Inventors: Ajeetkumar Gaddipati, Waukesha, WI (US); Robert Donald Peters, Sussex, WI (US); Michael R. Hartley, Novi, MI (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/906,367

(22) Filed: Feb. 16, 2005

(51) Int. Cl.
*G01V 3/00* (2006.01)

(52) U.S. Cl. ........................ 324/309; 324/307

(58) Field of Classification Search ............... 324/309, 324/307, 300, 318, 319, 322; 600/420, 410
See application file for complete search history.

(56) References Cited

U.S. PATENT DOCUMENTS 5,830,143 A * 11/1998 Mistretta et al. ............ 600/420
6,515,477 B1 * 2/2003 Tasaka et al. ............... 324/309
6,630,828 B1 * 10/2003 Mistretta et al. ............ 324/309
2005/0237057 A1 * 10/2005 Porter ........................ 324/307

OTHER PUBLICATIONS

Pipe JG, "Motion Correction with PROPELLER MRI," Magn Reson Med 42:963-969, 1999.

* cited by examiner

*Primary Examiner*—Brij B. Shrivastav
(74) *Attorney, Agent, or Firm*—Ziolkowski Patent Solutions Group, SC; Michael A. Della Penna; Carl B. Horton

(57) ABSTRACT

A method and system of MR imaging is disclosed that enables PROPELLER imaging to be feasibly carried out independently of slice orientation or anatomy of interest. The invention is directed to the acquisition of blades of MR data that are rotated about a central region of k-space and reconstructing an image of arbitrary slice orientation from the blades of MR data that is substantially absent of radial ripple artifacts caused by phase aliasing from tissue outside the field of view in the slice plane.

20 Claims, 9 Drawing Sheets

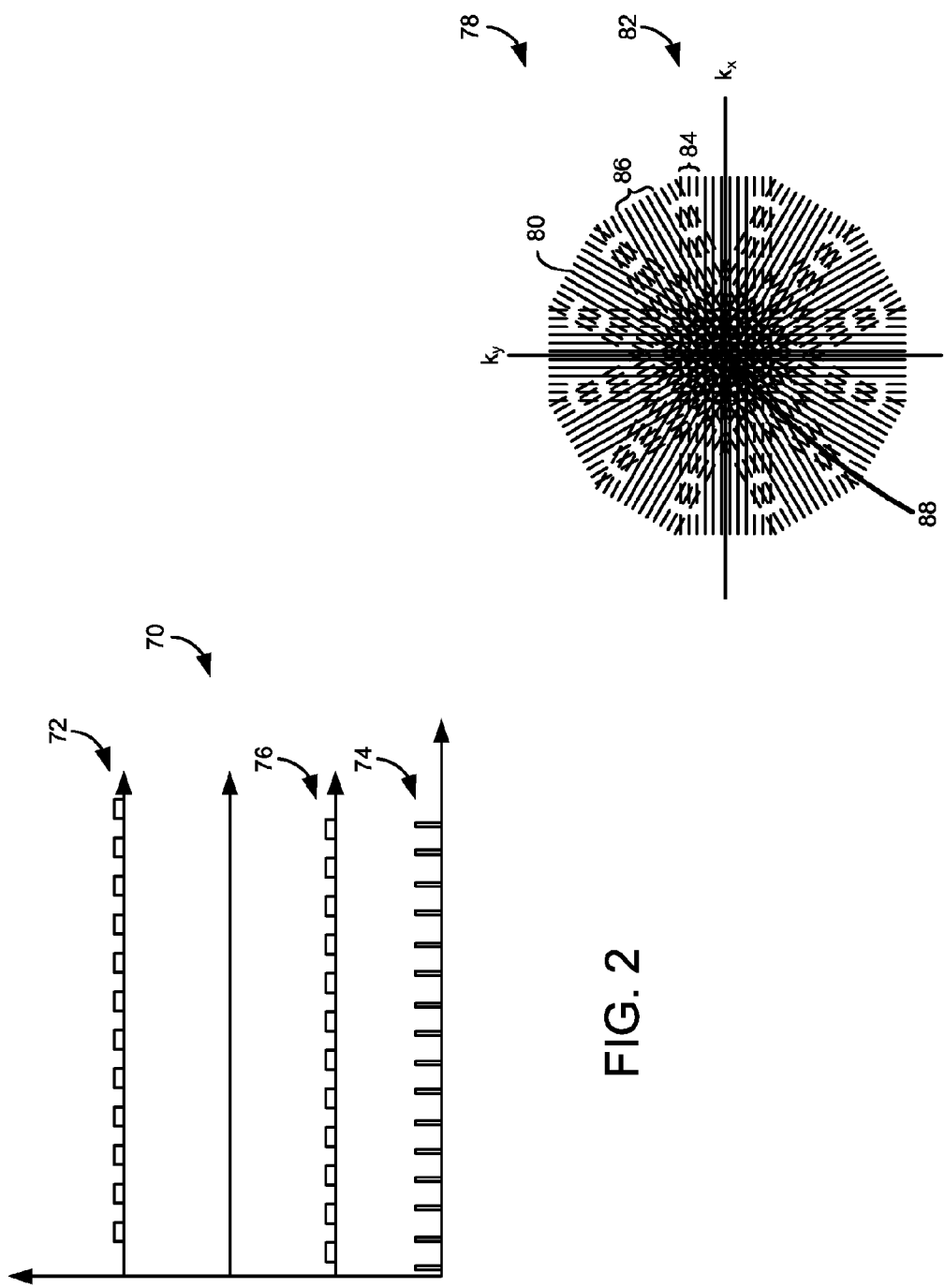

METHOD AND SYSTEM OF MR IMAGING WITH REDUCED RADIAL RIPPLE ARTIFACTS

BACKGROUND OF THE INVENTION

The present invention relates generally to diagnostic imaging and, more particularly, to a method and apparatus of reducing phase aliasing (radial ripple) artifacts in magnetic resonance (MR) imaging. The present invention is also directed to a process of filling a partially filled blade of k-space.

When a substance such as human tissue is subjected to a uniform magnetic field (polarizing field B0), the individual magnetic moments of the spins in the tissue attempt to align with this polarizing field, but precess about it in random order at their characteristic Larmor frequency. If the substance, or tissue, is subjected to a magnetic field (excitation field B1) which is in the x-y plane and which is near the Larmor frequency, the net aligned moment, or "longitudinal magnetization", MZ, may be rotated, or "tipped", into the x-y plane to produce a net transverse magnetic moment Mt. A signal is emitted by the excited spins after the excitation signal B1 is terminated and this signal may be received and processed to form an image.

When utilizing these signals to produce images, magnetic field gradients (Gx, Gy, and Gz) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Fast Spin Echo (FSE) imaging is an MR imaging technique commonly used as an efficient method of collecting MRI data with minimal artifact. But even FSE images suffer from ghosting artifacts resulting from voluntary or involuntary patient motion as the image acquisition usually takes a few minutes.

A number of imaging techniques has been developed to reduce motion artifacts of FSE images. One such FSE technique, which is referred to as Periodically Rotated Overlapping Parallel Lines with Enhanced Reconstruction (PROPELLER) imaging, encodes an MR signal by collecting data during an echo train such that a rectangular strip, or "blade", through the center of k-space is measured. This strip is incrementally rotated in k-space about the origin in subsequent echo trains, thereby allowing adequate measurement of the necessary regions of k-space for a desired resolution.

Periodically Rotated Overlapping Parallel Lines with Enhanced Reconstruction has been shown to be very effective in reducing artifacts associated with inadvertent subject translational and rotational movements in near axial head scans. PROPELLER is relatively insensitive to motion as the center of k-space is sampled multiple times during acquisition. In addition, explicit correction for rotation and shift are used to further reduce motion artifacts. Notwithstanding the advantages of PROPELLER imaging, its applicability has been limited to axial head scans primarily as a result of radial ripple artifacts that have been observed in sagittal, coronal, and oblique (orientation significantly varying from axial) scans. These artifacts have also been observed in PROPELLER imaging of the liver and spine. To expand the applicability of PROPELLER to other slice orientations and other anatomies, these radial ripple artifacts must be reduced.

It would therefore be desirable to have a system and method of MR imaging implementing a PROPELLER or similar imaging protocol with a reduction of radial ripple artifacts.

BRIEF DESCRIPTION OF THE INVENTION

The present invention overcomes the aforementioned drawbacks with a system and method of reconstructing MR images from MR data acquired using a modified PROPELLER acquisition such that the MR images are substantially free of radial ripple artifacts.

A method and system of MR imaging is disclosed that enables PROPELLER imaging to be feasibly carried out independently of slice orientation or anatomy of interest. The invention is directed to the acquisition of blades of MR data that are rotated about a central region of k-space and reconstructing an image of arbitrary slice orientation from the blades of MR data that is substantially free from phase aliasing artifacts that heretofore have been found in coronal or sagittal PROPELLER images of a subject having anatomy outside of a given FOV.

Therefore, in accordance with one aspect of the invention, an MR imaging apparatus includes a plurality of gradient coils positioned about a bore of a magnet to impress a polarizing magnetic field. An RF transceiver system and an RF switch are controlled by a pulse module to transmit and receive RF signals to and from an RF coil assembly to acquire MR images. The MRI apparatus also includes a computer programmed to acquire blades of MR data from an FOV along any arbitrary slice orientation and fill k-space with the blades of MR data such that adjacent blades are rotated from one another in the slice plane. In a further aspect, the computer is also programmed to transform each blade of k-space data to image space, perform few corrections and transform the image space back to k-space whereupon an image is reconstructed that is substantially free of radial ripple artifacts.

According to another aspect, the present invention includes a method of MR data acquisition that includes exciting an echo train to sample for MR data acquisition from an FOV and sampling the echo train to partially fill a k-space blade having a plurality of k-space data lines extending through a central region of k-space. The method further includes filling a remainder of the partially filled k-space blade with data determined from that sampled from the echo train. The exciting, the sampling, and the filling steps are repeated until a plurality of k-space blades have been filled in k-space such that each k-space blade extends through the central region of k-space and adjacent k-space blades are rotated from one another about the central region of k-space.

In accordance with another aspect, the invention is embodied in a computer program stored on a computer readable storage medium and having instructions which, when executed by a computer, cause the computer to acquire a plurality of blades of k-space from an object having a portion thereof extending beyond an encoded FOV and image the blades of k-space. The computer is further caused to isolate a blade image describing a central portion of the FOV in a phase encoding direction and crop the blade image to remove data from phase encode locations outside the central portion of the FOV in the phase encoding direction. The instructions also cause the computer to transform the cropped blade image to a cropped blade of k-space and replace the blade of k-space corresponding to the isolated blade image with the cropped blade of k-space.

Various other features and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings:

FIG. 2 illustrates a portion of an exemplary PROPELLER pulse sequence applicable with the present invention.

FIG. 3 is a schematic representation of k-space filled with MR data acquired using the exemplary PROPELLER pulse sequence of FIG. 2.

DETAILED DESCRIPTION OF THE PREFERRED EMBODIMENT

Figure 1:
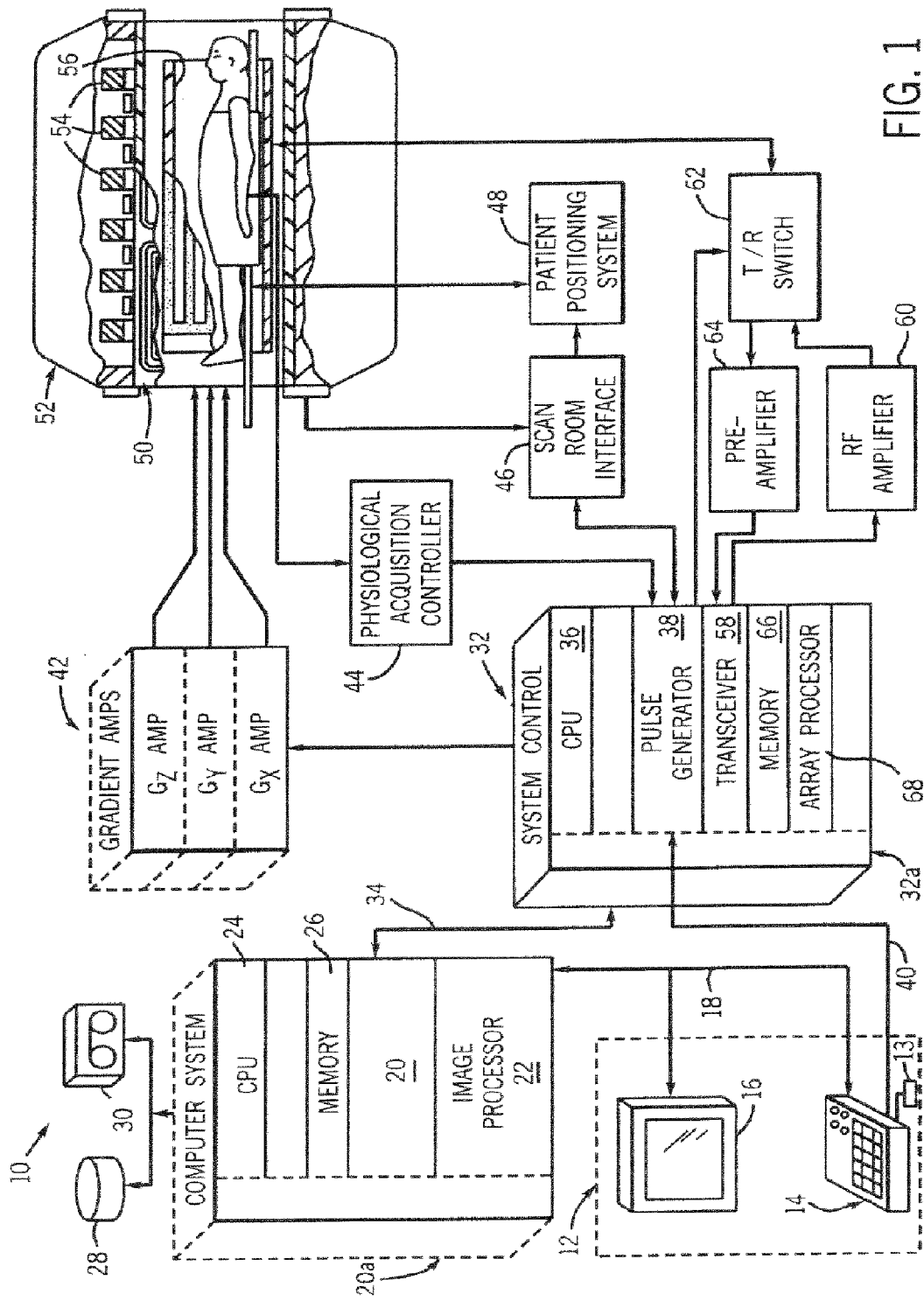
FIG. 1 is a schematic block diagram of an MR imaging system for use with the present invention.

Referring to FIG. 1, the major components of a preferred MR imaging system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

While the present invention will be described with respect to a PROPELLER based acquisition, it is contemplated that the present invention may also be applicable to other imaging techniques. In this regard, the present invention which advantageously reduces scan time, improves SNR and spatial resolution, and reduces phase aliasing may be applicable to a number of imaging techniques in addition to PROPELLER. It is also recognized that the present invention may also be applicable to PROPELLER variants such as split-blade PROPELLER and TURBOPROP.

Referring now to FIG. 2, a portion of a PROPELLER pulse sequence 70 is shown. The pulse sequence 70, in the illustrated example, is designed to acquire 12 spin-echoes 72 from a region of interest. The spin-echoes are all collected relative to single axis, e.g. Gx. Each spin-echo 72 is acquired following an RF refocusing pulse 74 and during a frequency encoding pulse 76, a series of which are played out during steady-state conditions. The spin echo data is used to fill k-space which is schematically represented in FIG. 3. The pulse sequence is repeated until k-space is filled, which results in an over-sampling of the central region of k-space.

FIG. 3 illustrates schematically a k-space 78 filled with MR data acquired as a result of repeated applications of the PROPELLER pulse sequence described with respect to FIG. 2. With PROPELLER, each echo acquired corresponds to a single line 80 of k-space 76. As such, for a 12 spin-echo data acquisition, each blade 82 of k-space includes 12 lines of data. PROPELLER based imaging implements a rotation of the blades of k-space data with each echo-train. In this regard, the blade of k-space will be incrementally rotated about the center 88 of k-space with each echo-train acquisition until k-space is filled.

Figure 4:
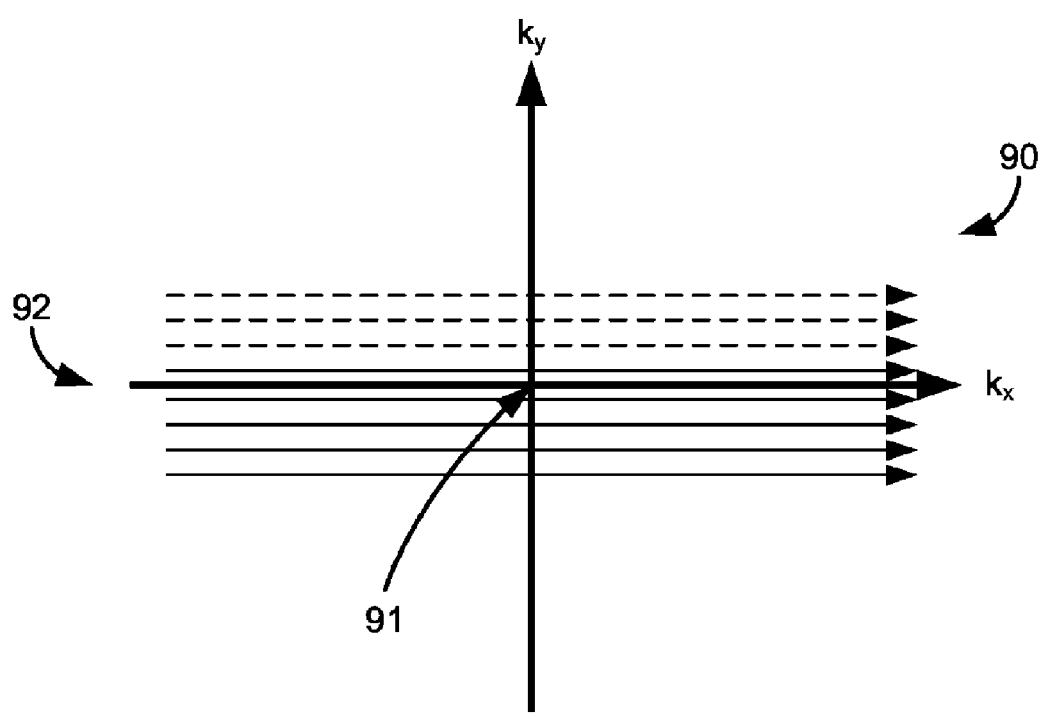
FIG. 4 is a schematic representation of a single blade of k-space that is filled using homodyne processing in accordance with another aspect of the present invention.

As described with respect to FIG. 3, k-space 78 is filled using a PROPELLER acquisition. Through this acquisition, all phase encode locations of a given blade extending through a central region of k-space are individually sampled. That is, each column of k-space corresponds to a phase encode location whereas each row corresponds to a frequency encoding location. Accordingly, each point in k-space can be identified by its phase encoding and frequency encoding position. The number of phase encode locations (or columns in k-space) is a function of the number of phase encoding gradients applied during sampling of an echo. As the number of phase encode locations increases as does the number of necessary phase encoding steps. As such, increasing the number of phase encoding locations necessarily increases scan time. Reducing the number of phase encoding locations reduces scan time, but at a loss of signal and resolution. Accordingly, in one embodiment, the present invention includes homodyne processing of a blade of k-space. This is illustrated in FIG. 4. For purposes of illustration, a single blade of k-space will be described, but one skilled in the art will appreciate that the homodyne processing technique described herein is applicable to each acquired blade of k-space.

K-space blade 90 extends through a central region 91 or origin of k-space such during subsequent rotation of the blade 90, the central region 91 will be over-sampled. K-space blade 90 is preferably defined by a number of k-space data lines 92, wherein each line 92 is characterized as either as sampled (solid line) or unsampled (dashed line). Further illustrated in FIG. 4 is that less than all phase encode locations (views) of the k-space blade 90 is filled with sampled MR data. Since less than all phase encode locations have been sampled, the number of phase encoding steps can be reduced. Alternatively, the number of phase encoding locations (and thus phase encoding steps) can be increased such that after partial filling of each k-space data line, the total number of phase encoding steps equals that of an acquisition not carrying out homodyne processing. As will be described, the un-sampled phase encode locations will be filled with data based on sampled phase encode locations.

While a number of partial Fourier reconstruction techniques may be used to determine data for un-sampled phase encode locations, one preferred technique is homodyne processing. Homodyne processing uses a pair of filters for Hermitian conjugate symmetry to determine data for un-sampled phase encode locations based on the data of sampled phase encode locations. In addition to providing data for un-sampled phase encode locations; homodyne processing also corrects phase errors or variations in the sampled data often attributable to variations in resonance frequency, flow, and motion. With homodyne processing or other partial Fourier reconstruction technique, un-sampled phase encoded locations (designated with an "U" in FIG. 4) may be "effectively" sampled without requiring the phase encoding steps that would otherwise be required. Additionally, the time needed to sample an echo (TE) is effectively reduced, which also reduces scan time and increases subject throughput.

It is preferred for the sampled phase encode locations to include slightly more than one-half of a row of k-space. In this regard, spatial-frequency data is acquired for phase encode locations about the center of the k-space data line. Thus, it is contemplated that the number of phase encoding steps can be reduced by slightly less than one-half. On the other hand, the number of phase encoding gradients applied are not reduced, but redefined such that almost all sampled phase encode locations are positioned in slightly more than one-half of the k-space data line. As a result, scan time is not reduced, but signal to noise is increased and spatial resolution improved. In effect, the number of phase encode locations can be doubled without requiring a doubling in the number of phase encoding steps. In fact, it is contemplated that more than a doubling of the number phase encoding locations (phase FOV) is possible with the present invention.

Figure 6:
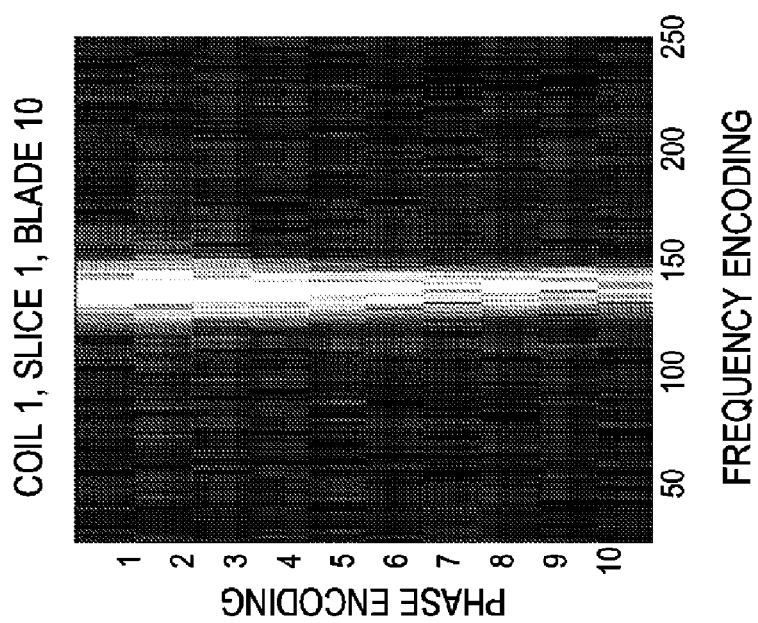
FIG. 6 is an image illustrating a partially filled blade of k-space.

Referring now to FIG. 6, the steps of a technique for acquiring MR data with a PROPELLER acquisition and reconstructing images substantially free of radial ripple artifacts are set forth. Process 94, which may be embodied in computer executable language and executed by one or more computers, begins at 96 with the prescription of a PROPELLER acquisition. At 96, parameters of the PROPELLER acquisition are read from a number of user inputs or automatically determined. These parameters include such settings as repetition time (TR), field-of-view (FOV) size, and slice orientation, e.g. axial, head, coronal, or oblique. As described above, the present invention is particularly directed to reducing radial ripple (phase aliasing) artifacts in images reconstructed from MR data acquired in a coronal, sagittal, or oblique PROPELLER scan.

After the parameters of the PROPELLER scan have been input, set, and otherwise determined, MR data is acquired at 98. Encoded and excited echoes are sampled and used to partially fill blades of k-space that are rotated from one another and extend through the central region of k-space. A blade homodyne processing step 900 is then carried out to determine data for un-sampled phase encode locations from the sampled phase encode locations, as described with respect to FIG. 4. After blade homodyne processing 100, an image space phase correction is carried out at 102 to correct phase errors in the image space data. After phase error correction 102, the phase corrected image space is downsampled at 104 using an inverse Fast Fourier Transform (FFT). Downsampling is carried out at 104 to determine the blade of k-space that describes only the central portion of the FOV in the phase encode direction. This is achieved by cropping the blade of k-space that corresponds to the central portion of the FOV in the phase encode direction such that data from outside the central portion is excluded during image reconstruction. Thus, after the blade image space has been cropped, the resulting blade image is inverse FFTed to recover the k-space blade. This k-space blade is then passed into the remainder of the PROPELLER reconstruction process which is carried out to reconstruct an image from all k-space blades.

Specifically, after downsampling 104, a number of PROPELLER reconstruction steps are carried out to correct for motion. These motion correction steps include a rotation correction 106, a translation correction 108, a correlation weighting 110, and, finally, image reconstruction 112. After image reconstruction 112, the process ends at 114. As a result of the aforementioned steps, the resulting reconstructed image is substantially free of radial ripple (phase aliasing) artifacts.

One advantage of the present invention is that blade homodyne and downsampling steps can seamlessly fit into conventional PROPELLER reconstruction techniques, yet, increase SNR and spatial resolution, and remove phase aliasing along each radial PROPELLER blade. Thus, the radial ripple artifacts that typically appear in images from anatomy that extends beyond the phase FOV are reduced. That is, the present invention reduces phase aliasing artifacts that can appear as a result of the combination of phase wraps between PROPELLER blades.

Figure 7:
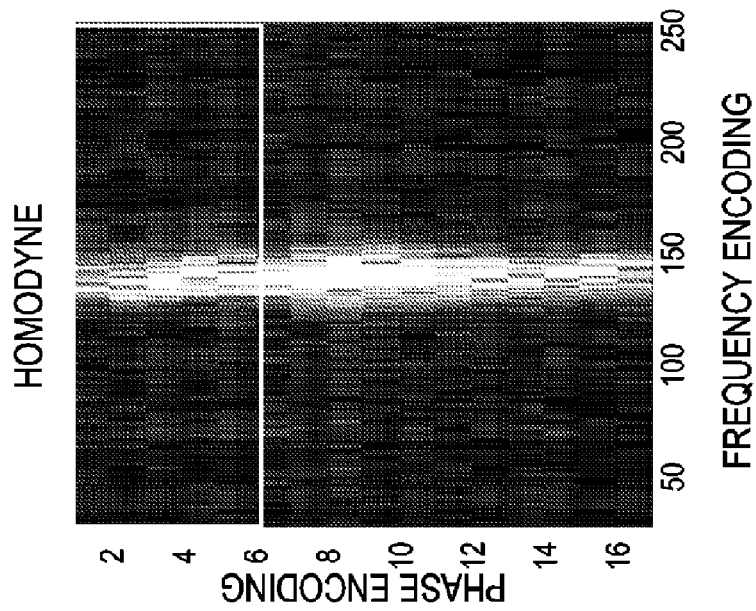
FIG. 7 is an image illustrating a blade of k-space that was originally partially filled and subsequently filled using homodyne processing.

Referring now to FIGS. 6 and 7, two blade images illustrate the blade homodyne processing steps described above with respect to FIG. 4. FIG. 6 is a ten view blade image showing eight views in one-half of k-space and two views in the other half of k-space. After homodyne processing, the ten views are converted to a sixteen view blade showing eight views in one-half of k-space and eight views in the other half of k-space. As a result of the blade homodyne processing, six additional views of data are used during image reconstruction which improves SNR and spatial resolution without six additional and time consuming phase encoding steps during data acquisition.

Figure 5:
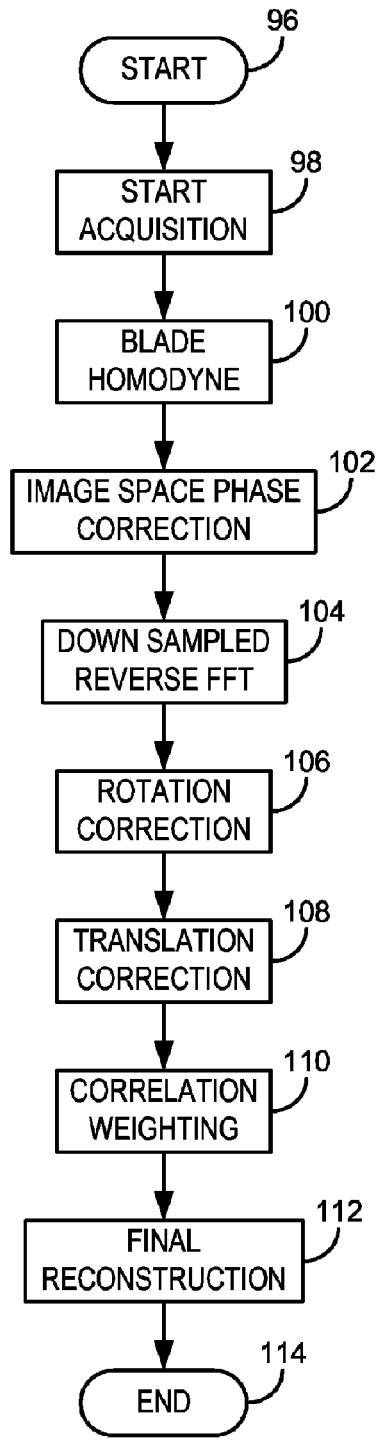
FIG. 5 is a flow chart setting forth the steps of a PROPELLER reconstruction in accordance with another aspect of the present invention.
Figure 8:
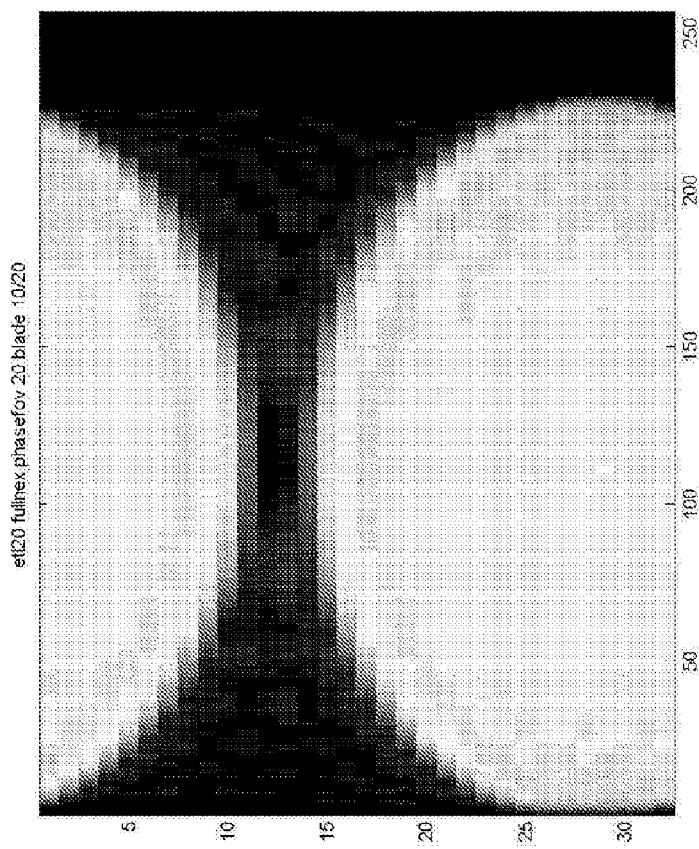
FIG. 8 is a single blade image reconstructed from a spherical phantom having a portion thereof extending beyond a phase FOV using a conventional PROPELLER acquisition.
Figure 9:
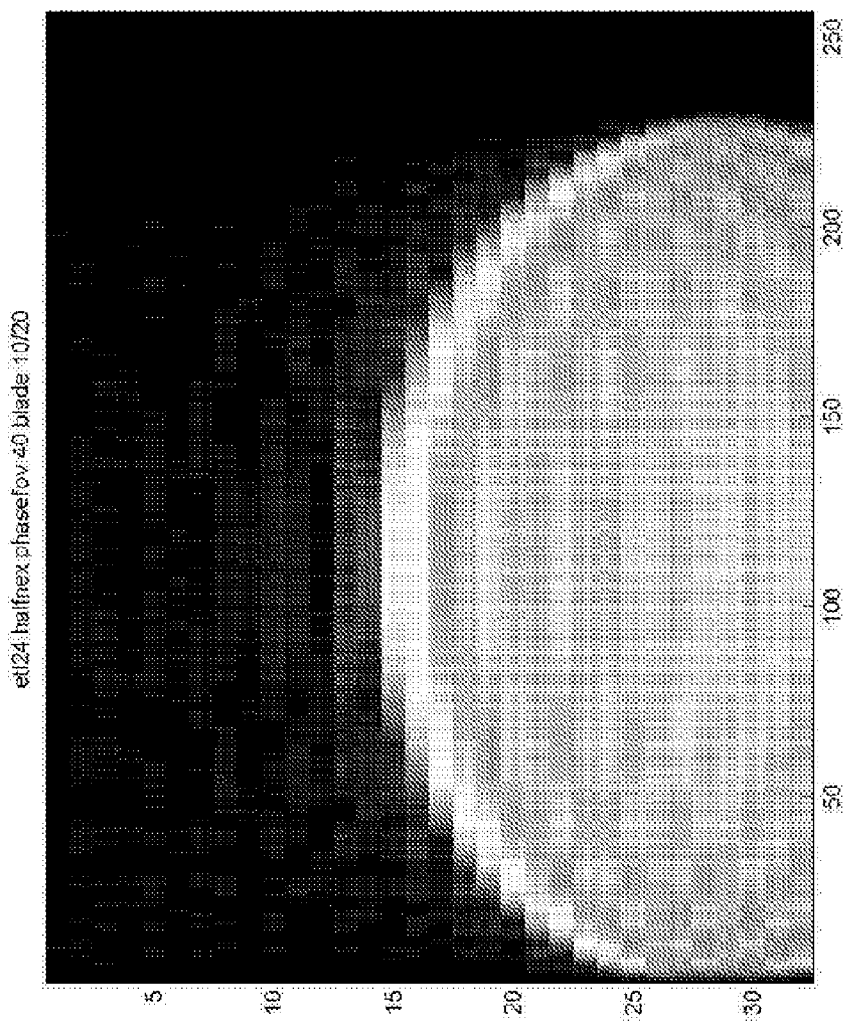
FIG. 9 is a single blade image reconstructed from the spherical phantom imaged in FIG. 8 with reduced phase aliasing in accordance with one aspect of the present invention.

Shown in FIG. 8 is an image reconstructed from a spherical phantom having a portion thereof extending beyond an FOV using a conventional PROPELLER acquisition. As shown, aliasing results along the phase encoding direction. On the other hand and referring to FIG. 9, when the same spherical phantom is imaged according to the present invention, the phase aliasing or radial ripple artifacts that are prevalent in FIG. 8 are removed. In this regard, no phase wrap occurs in the phase encoding direction notwithstanding the object extending beyond the FOV in the phase encoding direction. It is noted that the images of FIG. 8 was captured using a PROPELLER based acquisition with an echo train length (ETL) of 24, full NEX, and a phase FOV of 20 cm. The image of FIG. 9 was acquired using PROPELLER, ETL=24, half NEX, and a phase FOV of 40 cm. Thus, the homodyne process described with respect to FIG. 5 was used to effectively double the FOV in the phase encoding direction.

Figure 11:
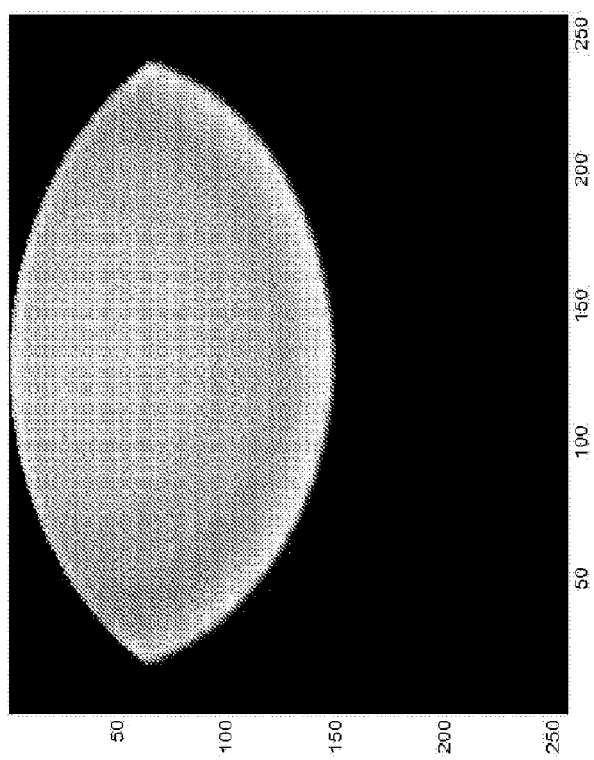
FIG. 11 is an image of the phantom imaged in FIG. 10, but from blades of data acquired at different orientations with a modified PROPELLER reconstruction technique in accordance with one aspect of the present invention.
Figure 10:
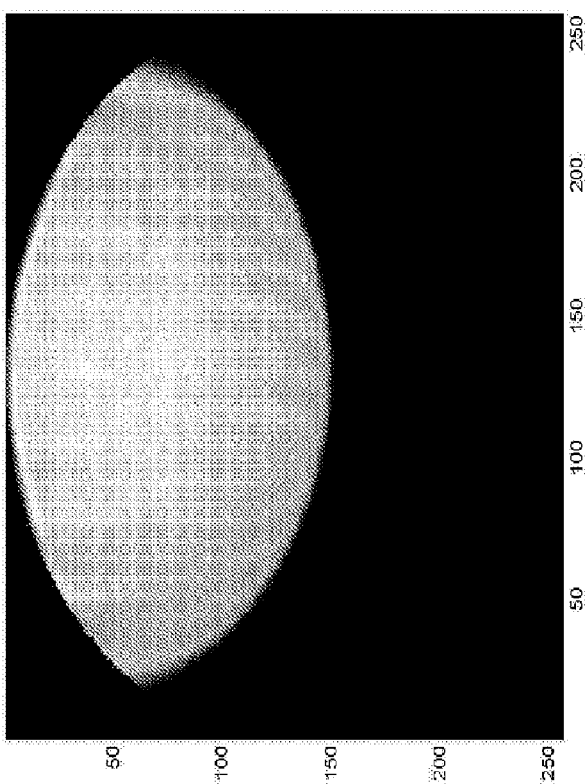
FIG. 10 is an image of a phantom reconstructed from blades of data acquired at different orientations using a conventional PROPELLER reconstruction technique.

FIGS. 10 and 11 further illustrate the advantages achieved with the present invention. Specifically, as shown in FIG. 10, conventional PROPELLER reconstruction of all blades acquired from an object that extends beyond an FOV in the phase encoding direction results in ripples in the image. These ripples are the results of phase wrap aliasing. On the other hand, FIG. 11, which is an image of the same object imaged in FIG. 10, but with the modified PROPELLER acquisition described herein, lacks the phase aliasing ripples. The image of FIG. 11 is considerably more uniform than the image of FIG. 10, and thus, of greater diagnostic value.

Figure 13:
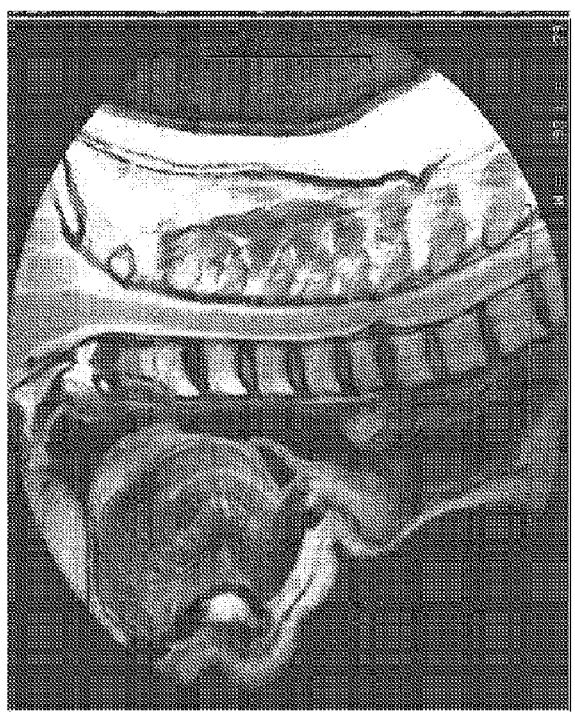
FIG. 13 is a spinal image also taken along the sagittal plane using a modified PROPELLER acquisition in accordance with one aspect of the present invention and absent the radial ripple (phase aliasing) artifacts that are found in the image of FIG. 12.
Figure 12:
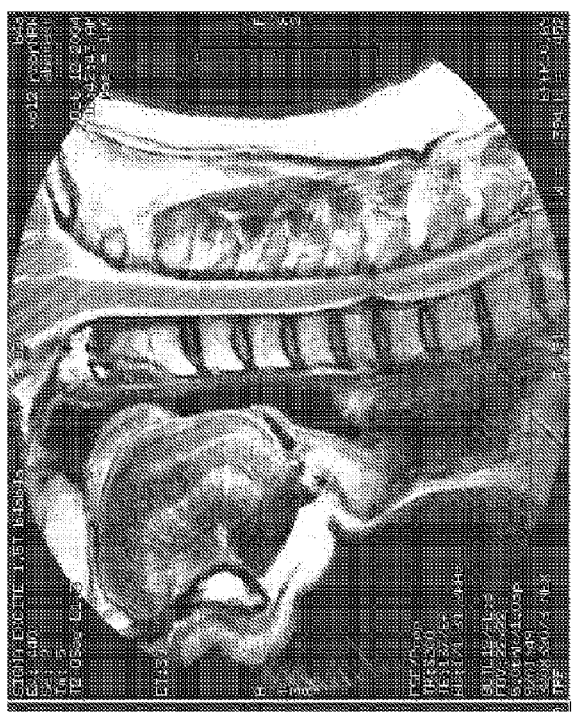
FIG. 12 is a spinal image taken along the sagittal plane using a conventional PROPELLER acquisition.

FIGS. 12 and 13 further illustrate the advantages achieved with the present invention. Specifically, as shown in FIG. 12, a conventional T2-PROPELLER reconstruction of a spinal image taken along the sagittal plane can result in radial ripple artifacts that, in the illustrated Figure, appear as streaks in the spinal column region. On the other hand, the modified PROPELLER acquisition disclosed herein and in accordance with the present invention reduces those radial ripple artifacts, as illustrated in FIG. 13. Specifically, the "streaking" seen in FIG. 12 is not present in FIG. 13.

Therefore, an MRI apparatus includes a plurality of gradient coils positioned about a bore of a magnet to impress a polarizing magnetic field. An RF transceiver system and an RF switch are controlled by a pulse module to transmit and receive RF signals to and from an RF coil assembly to acquire MR images. The MRI apparatus also includes a computer programmed to acquire blades of MR data from an FOV along one of a coronal and a sagittal slice orientation and fill k-space with the blades of MR data such that adjacent blades are rotated from one another. The computer is also programmed to transform the k-space to image space and reconstruct an image substantially free of radial ripple artifacts from the image space.

A method of MR data acquisition is also disclosed and includes exciting an echo train to sample for MR data acquisition from an FOV and sampling the echo train to partially fill a k-space blade having a plurality of k-space data lines extending through a central region of k-space. The method further includes filling a remainder of the partially filled k-space blade with data determined from that sampled from the echo train. The exciting, the sampling, and the filling steps are repeated until a plurality of k-space blades have been filled to fill k-space such that each k-space blade extends through the central region of k-space and adjacent k-space blades are rotated from one another about the central region of k-space.

The invention is also embodied in a computer program stored on a computer readable storage medium and having instructions which, when executed by a computer, cause the computer to acquire a plurality of blades of k-space from an object having a portion thereof extending beyond an FOV, and image the blades of k-space. The computer is further caused to isolate a blade image describing a central portion of the FOV in a phase encoding direction and crop the blade image to remove data from phase encode locations outside the central portion of the FOV in the phase encoding direction. The instructions also cause the computer to transform the cropped blade image to a cropped blade of k-space and replace the blade of k-space corresponding to the isolated blade image with the cropped blade of k-space.

The present invention has been described in terms of the preferred embodiment, and it is recognized that equivalents, alternatives, and modifications, aside from those expressly stated, are possible and within the scope of the appending claims.

The invention claimed is:

1. An MR imaging apparatus comprising:
   a plurality of gradient coils positioned about a bore of a magnet to impress a polarizing magnetic field and an RF transceiver system and an RF switch controlled by a pulse module to transmit RF signals to an RF coil assembly to acquire MR images; and
   a computer programmed to:
   acquire blades of MR data from an FOV along any slice orientation;
   fill k-space with the blades of MR data such that adjacent blades are rotated from one another;
   transform the k-space to image space; and
   reconstruct an image substantially free of radial ripple artifacts from the image space.

2. The MR imaging apparatus of claim 1 wherein the computer is further programmed to orientate the blades of MR data such that each blade extends through a central region of k-space.

3. The MR imaging apparatus of claim 1 wherein the computer is further programmed to reconstruct the image substantially free of phase aliasing artifacts.

4. The MR imaging apparatus of claim 1 wherein the computer is further programmed to partially sample an echo to partially acquire a blade of MR data and determine a remainder of the blade of MR data from that which is partially acquired from the echo.

5. The MR imaging apparatus of claim 4 wherein the computer is further programmed to:
   generate a blade image for each blade of MR data;
   isolate the blade image which corresponds to a central region of the FOV in a phase encoding direction;
   crop the blade image to remove phase encode data from outside the central region of the FOV in the phase encoding direction;
   transform the cropped blade image to a cropped blade of MR data;
   replace the blade of MR data from which the isolated blade image was generated with the cropped blade of MR data; and
   transform the cropped blades of MR data to image space.

6. The MR imaging apparatus of claim 5 wherein the computer is further programmed to apply an inverse Fast Fourier Transform (FFT) to transform the cropped blade image to the cropped blade of MR data.

7. The MR imaging apparatus of claim 1 wherein the computer is further programmed to correct for motion artifacts prior to image reconstruction.

8. The MR imaging apparatus of claim 1 wherein the computer is further programmed to acquire MR data from an arbitrary anatomical object of interest that at least partially extends outside the FOV.

9. The MR imaging apparatus of claim 1 wherein the computer is further programmed to acquire the blades of MR data with a PROPELLER acquisition.

10. A method MR data acquisition comprising the steps of:
    exciting an echo train to sample for MR data acquisition from an FOV;
    sampling the echo train to partially fill a k-space blade of a plurality of k-space data lines extending through a central region of k-space;
    filling a remainder of the partially filled k-space blade with data determined from that sampled from the echo train; and
    repeating the exciting, the sampling, and the filling steps until a plurality of k-space blades have been filled to fill k-space, each k-space blade extending through the central region of k-space and adjacent k-space blades being rotated from one another about the central region of k-space.

11. The method of claim 10 wherein the step of sampling includes partially sampling the echo train to acquire MR data for less than all phase encode locations of the plurality of k-space data lines.

12. The method of claim 11 further comprising the steps of determining data for un-sampled phase encode locations from data of sampled phase encode locations and populating unfilled portions of a given k-space data line with data determined from sampled phase encode locations for that given k-space data line.

13. The method of claim 12 further comprising the steps of reconstructing a blade image for each k-space blade of data and determining which blade image corresponds to a central region of the FOV along a phase encode direction.

14. The method of claim 13 further comprising the step of cropping the blade image that corresponds to the central region of the FOV along the phase encode direction to exclude data from phase encode locations corresponding to anatomy outside the FOV.

15. The method of claim 14 further comprising the steps of downsampling the cropped blade image to yield a cropped k-space blade, replacing the data of the k-space blade corresponding to the blade image that was cropped with data of the cropped k-space blade, and reconstructing an image from the plurality of k-space blades that includes the cropped k-space blade.

16. The method of claim 10 further comprising the step of slice encoding the FOV along one of a coronal and a sagittal slice direction.

17. A computer readable storage medium having a computer program stored thereon and representing a set of instructions that when executed by a computer causes the computer to:
    acquire a plurality of blades of k-space from an object having a portion thereof extending beyond an FOV;
    image the blades of k-space;
    isolate a blade image describing a central portion of the FOV in a phase encoding direction;
    crop the blade image to remove data from phase encode locations outside the central portion of the FOV in the phase encoding direction;
    transform the cropped blade image to a cropped blade of k-space; and
    replace the blade of k-space corresponding to the isolated blade image with the cropped blade of k-space.

18. The computer readable storage medium of claim 17 wherein the set of instructions further causes the computer to acquire the plurality of blades of k-space with a PROPELLER acquisition.

19. The computer readable storage medium of claim 17 wherein the set of instructions further causes the computer to acquire the plurality of blades of k-space relative to an arbitrary axis of orientation.

20. The computer readable storage medium of claim 17 wherein the set of instructions further causes the computer to acquire the plurality of blades of k-space from an object that at least partially extends beyond an FOV in a phase encode direction.

* * * * *